(12) United States Patent
Bakalski

(10) Patent No.: US 9,275,986 B2
(45) Date of Patent: Mar. 1, 2016

(54) TRANSISTOR AND TUNABLE INDUCTANCE

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 14/080,132

(22) Filed: Nov. 14, 2013

(65) Prior Publication Data

US 2015/0130556 A1 May 14, 2015

(51) Int. Cl.
*H01L 27/06* (2006.01)
*H01L 23/522* (2006.01)

(52) U.S. Cl.
CPC ........ *H01L 27/0629* (2013.01); *H01L 23/5223* (2013.01); *H01L 23/5227* (2013.01); *H01L 27/0617* (2013.01); *H01L 27/0688* (2013.01); *H01L 2924/0002* (2013.01)

(58) Field of Classification Search
CPC ........................ H01L 27/0629; H01L 27/0617
See application file for complete search history.

(56) References Cited

U.S. PATENT DOCUMENTS

| | | | |
|---|---|---|---|
| 4,081,792 A * | 3/1978 | Schussler et al. | ............ 340/2.29 |
| 5,210,047 A * | 5/1993 | Woo et al. | ...................... 438/257 |
| 5,631,179 A * | 5/1997 | Sung et al. | ..................... 438/264 |
| 6,624,484 B2 * | 9/2003 | Christensen | ........ H01L 23/4824 257/213 |
| 7,791,160 B2 * | 9/2010 | Kim et al. | ...................... 257/499 |
| 8,115,575 B2 * | 2/2012 | Hsu | ......................... H03H 11/08 333/214 |
| 8,466,536 B2 * | 6/2013 | Loke | ................... H01L 23/5225 257/277 |
| 8,742,859 B2 * | 6/2014 | Jin | ......................... H01F 21/12 331/117 FE |
| 8,853,832 B2 * | 10/2014 | Cantoni | ........................ 257/659 |
| 8,952,379 B2 * | 2/2015 | Yamazaki et al. | .............. 257/43 |
| 2003/0025579 A1 * | 2/2003 | Christensen | ........ H01L 23/4824 333/213 |

OTHER PUBLICATIONS

Edward B. Rosa; "The Self and Mutual Inductances of Linear Conductors"; Bulletin of the Bureau of Standards; vol. 4, No. 2, p. 301-344, Sep. 15, 1907.
"Impedance Matching Network Designer"; http://www.home.sandiego.edu/ekim/e194rfs01/jwmatcher/matcher2.html; Oct. 30, 1997, p. 1-3.
Prof. Ali M. Niknejad; "EECS 142/242M Integrated Circuits for Communication"; Lecture 11: Matching Networks; University of California, Berkley; http://rfic.eecs.berkeley.edu/142/pdf/lect10.pdf; 2012; p. 1-32.

* cited by examiner

*Primary Examiner* — Evan Pert
(74) *Attorney, Agent, or Firm* — Eschweiler & Associates, LLC

(57) ABSTRACT

According to a first aspect embodiments provide a transistor including at least one gate region between at least one drain region and at least one source region, wherein a ratio between a width of the gate region and a length of the gate region exceeds 300.

19 Claims, 11 Drawing Sheets a)

b)

TRANSISTOR AND TUNABLE INDUCTANCE

FIELD

Embodiments generally relate to inductances and/or capacitances and, more particularly, to implementations of inductances and/or capacitances using transistors.

BACKGROUND

Radio Frequency (RF) circuits such as filters, resonators and RF matching networks usually require one or more inductances and one or more capacitances. Tunable RF circuits may furthermore be desired to address multi-band and/or multi-standard operation. For such scenarios it is desirable to have tunable inductances and/or capacitances. Until today, tunable capacitors with high Quality factors (Q factors) are available in some technologies and approaches as, for example, varactor diodes, MEMS, switched capacitors, Barium Strontium Titanate (BST) capacitors, etc. However for tunable inductances the approaches usually suffer from issues, such as nonlinear behavior, not suited for high RF voltage and power levels or too low Q factors.

SUMMARY

According to a first aspect, embodiments provide a transistor. The transistor includes at least one gate region between at least one drain region and at least one source region. A ratio between a width of the gate region and a length of the gate region exceeds 300. This may yield a relatively high ON-mode inductance and/or a relatively high OFF-mode capacitance of the transistor.

In some embodiments the length of the gate region may correspond to a length of a conduction channel between the drain region and the source region. The width of the gate region may be larger than 50 µm in one or more embodiments. Thereby width and/or the length of the gate region may depend on an employed semiconductor process technology.

In one or more embodiments the transistor may include a stack of at least one semiconductor layer and a plurality of metal layers. The at least one drain region and the at least one source region may be formed in the at least one semiconductor layer. A plurality of interconnected drain contact regions and a plurality of interconnected source contact regions may be formed in the plurality of metal layers. The plurality of metal layers may be on top of the semiconductor layer.

The at least one drain region may be connected to a drain contact pad via the plurality of interconnected drain contact regions. A first drain contact region may be formed in a first metal layer. A second drain contact region may be formed in a second metal layer. The at least one source region may be connected to a source contact pad via the plurality of interconnected source contact regions. A first source contact region may be formed in the first metal layer. A second source metal region may be formed in the second metal layer.

In one or more embodiments the plurality of interconnected drain contact regions and the plurality of interconnected source contact regions may be formed in the plurality of metal layers to yield an off-mode capacitance $C_{off}$ of the transistor above a predefined threshold. In some implementations the off-mode capacitance $C_{off}$ of the transistor at a reference frequency $f_{ref}$ may be $$C_{off} > \frac{10}{2\pi f_{ref} R_{ref}},$$

wherein $R_{ref}$ denotes a reference resistance of a reference system.

In some embodiments a maximum distance between the plurality of interconnected drain contact regions and the plurality of interconnected source contact regions may be smaller than or equal to a maximum distance between the drain region and the source region. A minimum distance between the plurality of interconnected drain contact regions and the plurality of interconnected source contact regions may substantially correspond to the length of the gate region. In some embodiments a length of a drain contact region may substantially correspond to the width of the at least one gate region. Likewise, a length of a source contact region may substantially correspond to the width of the at least one gate region. This may yield a high ON-mode inductance and/or a high OFF-mode capacitance of the transistor.

In one or more embodiments a first drain contact region and an adjacent second contact metal region may be interconnected via a Metal-Insulator-Metal (MIM) capacitor to further increase an off-mode capacitance of the transistor. Likewise, a first source metal region and an adjacent second source metal region may be interconnected via a MIM capacitor.

For a possibly high OFF-mode capacitance all metal layers of the stack may be used for contact regions for the at least one drain region and the at least one source region in some embodiments.

In some embodiments the at least one gate region, the at least one drain region, the at least one source region, and associated metallization regions may be dimensioned in a volume of the transistor such that an inductance of the transistor deviates from $$L = 2\left[\left(\frac{2l}{a+b}\right) + \frac{1}{2} + \frac{0.2235(a+b)}{l}\right]$$

by less than 20%, wherein l denotes the width of the gate region, a denotes a breadth of the volume, and b denotes a height of the volume.

In some embodiments the transistor may include a multi-finger Metal Oxide Semiconductor (MOS) transistor structure. Thereby the gate region corresponds to one of a plurality of gate fingers of the multi-finger MOS transistor structure.

In one or more embodiments an area of the transistor may have a substantially rectangular shape. A number of gate fingers associated with a breadth of the area may be less than 30.

In some embodiments the transistor may be formed in a stack of at least one semiconductor layer for the at least one drain region and the at least one source region. A plurality of metal layers may be foreseen for related contact regions. A shape of metal contact regions in the plurality of metal layers may be formed to model a shape of a slab inductor.

According to a further aspect, embodiments provide a transistor. The transistor includes a stack of at least one semiconductor layer and a plurality of metal layers. The transistor includes at least one drain region and at least one source region formed in the at least one semiconductor layer. A plurality of interconnected drain metal regions is formed in the plurality of metal layers. The plurality of interconnected drain metal regions is electrically connected to the drain region. A plurality of interconnected source metal regions is formed in the plurality of metal layers. The plurality of interconnected source metal regions is electrically connected to the source region. A maximum distance between a drain metal region and a corresponding source metal region in the same metal layer is smaller than or equal to a maximum distance between the drain region and the source region.

The at least one drain region may be connected to a drain contact pad via the plurality of drain metal regions. The plurality of drain metal regions may be arranged as an array of stacked drain metal regions. A first drain metal region may be formed in a first metal layer. A second drain metal region may be formed in an adjacent second metal layer. The at least one source region may be connected to a source contact pad via the plurality of source metal regions. The plurality of source metal regions may be arranged as an array of stacked source metal regions. A first source metal region may be formed in the first metal layer. A second source metal region may be formed in the second metal layer.

The plurality of interconnected drain metal regions and the plurality of interconnected source metal regions may be formed in the plurality of metal layers to yield an OFF-mode capacitance $C_{off}$ of the transistor above a predefined threshold. For example, $$C_{off} > \frac{10}{2\pi f_{ref} R_{ref}},$$

for a reference frequency $f_{ref}$ and a reference resistance $R_{ref}$ of a reference system.

In one or more embodiments a first drain metal region and an adjacent second drain metal region may be interconnected via a MIM capacitor. Likewise, a first source metal region and an adjacent second source metal region may optionally be interconnected via a MIM capacitor.

In some embodiments the transistor may include at least one gate region between the at least one drain region and the at least one source region. A ratio between a width of the gate region and a length of the gate region may exceed 300. The width of the gate region may be larger than 50 μm. The width and the length of the gate region may depend on an employed semiconductor process technology.

A minimum distance between a drain metal region and a corresponding source metal region in the same metal layer may correspond to the length of the gate region in some embodiments.

According to yet a further aspect, embodiments provide a tunable inductance. The tunable inductance includes a plurality of multi-finger Field Effect Transistors (FETs) Each multi-finger FET includes multiple fingers. A ratio between a width of a finger and a length of the finger exceeds 300. An inductance of a multi-finger FET depends on a dimension of a metallization associated with its multiple fingers.

In some embodiments a ratio between a width of a gate finger and a length of the gate finger may exceed 300. The geometry of the metallization may be formed to model a shape of a slab inductor. Optionally, the metallization of a multi-finger FET may be formed to yield an off-mode capacitance $C_{off}$ of the transistor above a predefined threshold For example, $$C_{off} > \frac{10}{2\pi f_{ref} R_{ref}},$$

for a reference frequency $f_{ref}$ and a reference resistance $R_{ref}$ of a reference system.

In some embodiments the plurality of multi-finger FETs may be connected in series. In other embodiments the plurality of multi-finger FETs may be connected in parallel.

In some embodiments control circuitry may be foreseen to decrease the tunable inductance by switching one or more multi-finger FETs in an OFF-mode. The tunable inductance may be increased by switching one or more multi-finger FETs in an ON-mode.

According to yet a further aspect, it is provided a method for tuning a tunable inductance. The method includes providing a plurality of multi-finger FETs. Each multi-finger FET comprises a plurality of fingers. A ratio between a width of a finger and a length of the finger exceeds 300. The method also includes varying the tunable inductance by switching one or more of the multi-finger FET in an ON- or an OFF mode.

BRIEF DESCRIPTION OF THE FIGURES

Some embodiments of apparatuses and/or methods will be described in the following by way of example only, and with reference to the accompanying figures, in which.

DETAILED DESCRIPTION

Figure 1:
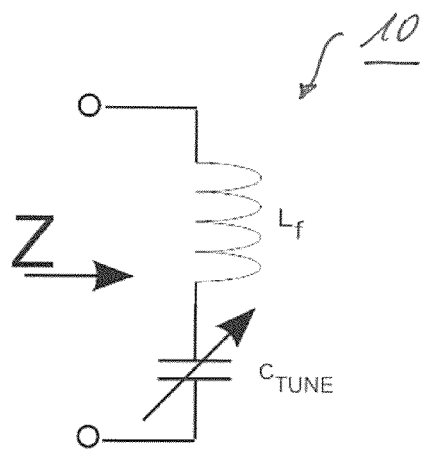
FIG. 1 is a schematic diagram that illustrates a L-C series circuit to tune a fixed inductor Lf using a tunable capacitance.

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Radio Frequency (RF) circuits such as filters, resonators or RF matching networks usually require one or more reactances. A reactance is the opposition of a circuit element to a change of electric current or voltage, due to that element's inductance or capacitance. Tunable RF circuits may furthermore be desired to address multi-band and/or multi-standard operation. For such scenarios it is desirable to have tunable inductances and/or capacitances. Tunable capacitors with high Quality factors (Q factors) are available in several technologies and approaches as, for example, varactor diodes, MEMS, switched capacitors, Barium Strontium Titanate (BST) capacitors, etc. However for tunable inductances these approaches usually suffer from nonlinear behavior, are not suited for high RF voltage and power levels or have too low Q factors.

FIG. 1 illustrates a possible approach for tuning an inductance.

A circuit 10 comprises a fixed inductor with inductance $L_f$ connected in series with a tunable capacitor having capacitance $C_{tune}$. Hence, the circuit 10 yields a tunable complex impedance, $$Z = j\omega L_f + \frac{1}{j\omega C_{tune}}.$$

In the resonator circuit of FIG. 1 the tuning problem is shifted to the capacitance $C_{tune}$. This approach works in that a fixed inductance imaginary part is reduced by the tunable capacitance according to $$Z = j\omega L_f + \frac{1}{j\omega C_{tune}} = j\omega\left(L_f - \frac{1}{\omega^2 C_{tune}}\right) \quad (1)$$

As one can see from equation (1), the complex impedance Z converges to $j\omega L_f$ if $C_{tune}$ gets high. As $C_{tune}$ gets smaller, the effective inductance $$\left(L_f - \frac{1}{\omega^2 C_{tune}}\right)$$

is reduced. However, regarding this tuning solution, the tuning effect of the capacitor $C_{tune}$ increases (because of $\omega^2$) with increasing frequency $\omega=2\pi f$.

Figure 2:
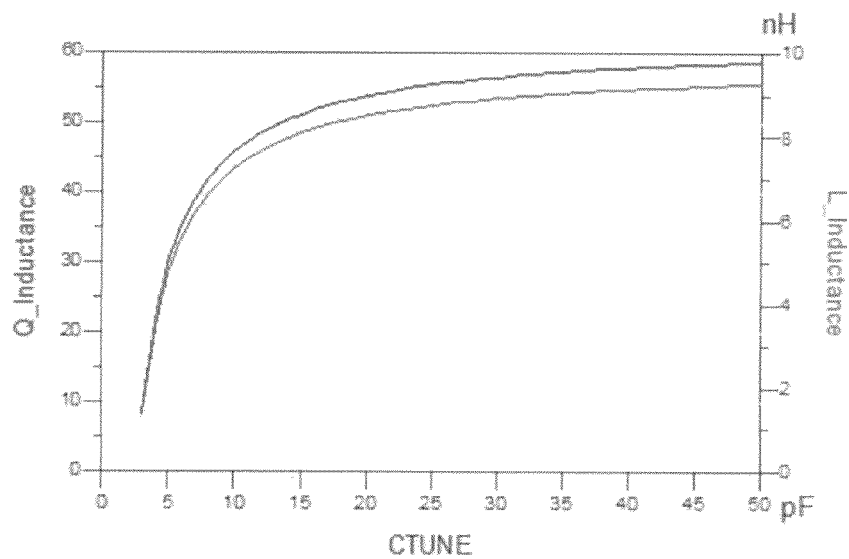
FIG. 2 is a graph that shows a resulting Q-factor and inductance of the L-C series circuit versus the a tunable capacitance.
Figure 3:
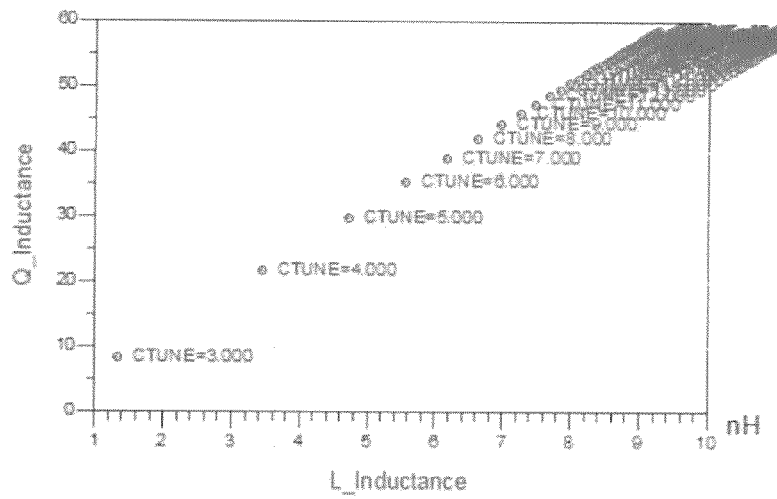
FIG. 3 is a graph that shows inductance and Q-factors of the L-C series circuit for discrete values of a tunable capacitance.

The so-called Quality factor (Q factor) is a widespread measure used to characterize resonators. The Q factor may be defined as the peak energy stored in the resonator circuit divided by the average energy dissipated in it per cycle at resonance frequency. Hence, the Q factor degrades when reducing $L_f$ and $C_{tune}$. FIG. 2 and FIG. 3 show example graphs related to a wire-wound $L_f$=10 nH device and an ideal tunable $C_{tune}$ in series. The related Q factor can be also derived from $$Q = \frac{\text{Im}(Z)}{\text{Re}(Z)} = \frac{\omega\left(L_f - \frac{1}{\omega^2 C_{tune}}\right)}{R} \quad (2)$$

The circuit 10 may also be referred to as a LC tank circuit. Hence for certain frequency and L-C combinations the circuit 10 will resonate and merely act as a matching network.

Some approaches of tuning inductances are, for example, using a ferrite in a core of the inductor. However this only works to up to frequencies of some MHz. Above such frequencies ferrites lose their functionality. Further, an inductance may be tuned by using a given inductor and switch taps on it. Thereby a tap may be understood as a contact made to a certain point along a winding of an inductor. However, this approach works only with a switch on each tap and on a final connection of the inductor. Shorting windings usually leads to a short-circuit winding, and hence to high losses. On the other hand, an on-resistance $R_{ON}$ of a switch may decrease the Q-factor:

$$Q = \frac{\text{Im}(Z)}{\text{Re}(Z)} = \frac{\omega L}{R_{Inductor} + R_{ON}} \quad (3)$$

If we consider an example of a typical Complementary Metal-Oxide-Semiconductor (CMOS) switch with an $R_{ON}$=3Ω and a 1 nH inductance with a Q factor of 10 at f=1 GHz, the $R_{Inductor}$ may be 0.63Ω and the overall R=3.63Ω, for example. Hence the switched inductance would only lead to Q=1.73. For a low $R_{ON}$ switch with ~1Ω, the Q factor would degrade down to Q~5. From this example two facts may be determined: First, the transistor's $R_{ON}$ is critical for the Q factor. Second, low Q factors cannot improve by forcing resonances.

Some embodiments are inspired by the so-called "slab inductor". Slab inductors are metal lines, for example on top of a semiconductor substrate, such as silicon, for example. They can be used for a low inductance value implementation and offer much higher Q factors than spiral inductors, as well as lower area occupation. Some calculation equations for this basic inductor type may be found in a paper by E. Rosa "The self and mutual inductance of linear conductors" (1908) in p. 313—"The self-inductance of a straight rectangular bar". The inductance L of a slab inductor may be approximated by $$L = 2\left[\left(\log\frac{2l}{\alpha+\beta}\right) + \frac{1}{2} + \frac{0.2235(\alpha+\beta)}{l}\right] \quad (4)$$

wherein l denotes the length of the metal line, β denotes its breadth or height, and α denotes its width.

Figure 4:
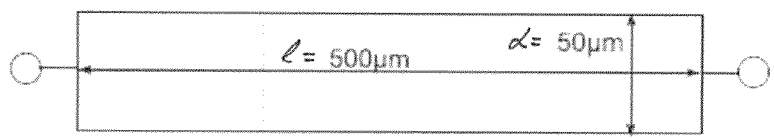
FIG. 4 is a diagram that illustrates a layout sketch of a 500 μm long slab inductor.
Figure 5:
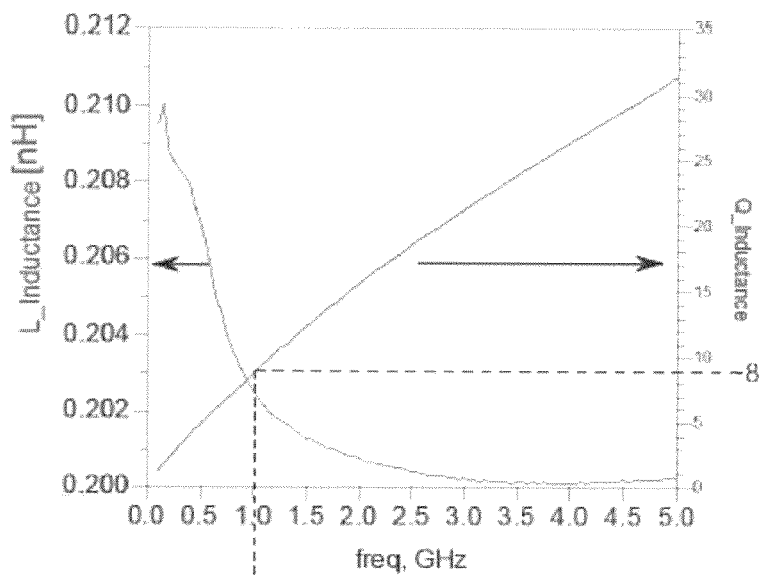
FIG. 5 is a graph that illustrates inductance and Q-factor of a 500 μm slab inductor using Al metallization.

However such metal lines or slab inductors on top of a semiconductor substrate may also yield substrate effects and/or skin effect, so that an overall inductance is somewhat more complicated and may be calculated by field simulations. As an example, the Infineon C11NP/C11RF metal stack is used as simulation base, using a top metal of β=2.4 μm. FIG. 4 illustrates an example of a slab inductor 40 on top of a semiconductor substrate. It has an example length l=500 μm in top metal with a width α=50 μm. FIG. 5 shows the resulting inductance ωL and the Q factor of the slab inductor 40. As one can see, for f=1 GHz the Q factors in the example technology are rather low, it achieves just a value of 8. One can see that adding a switch would downturn the Q factor in the Q=1 value range. Hence it would be desirable that a device could change its behavior from inductive to another state to avoid the loss.

According to some embodiments, a metallization of a transistor, for example an NMOS-switch transistor, may be formed such that it represents an inductance. To be more specific, the transistor's metallization may approximate a slab inductor to be modeled, as for example the slab inductor 40 of FIG. 4. In some embodiments the metallization may have the same dimension as the slab inductor to be modeled. For the example, a transistor according to an embodiment may be formed to have the same size as the simulated slab inductor 40 of FIG. 4. This would be a transistor with very long source/drain contacts and also very wide single gate finger as sketched in FIG. 6.

Figure 6:
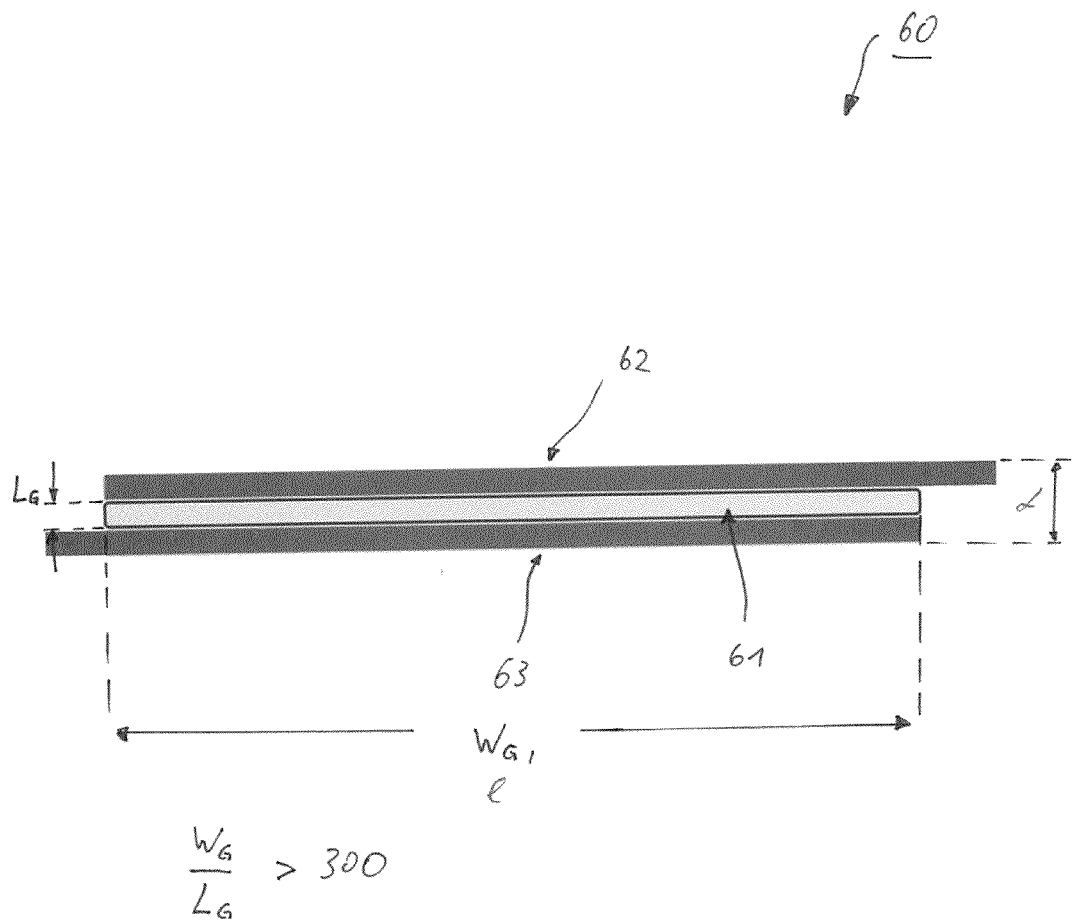
FIG. 6 is a schematic top view of an embodiment of a transistor.

FIG. 6 illustrates a schematic top view of a transistor 60 according to an embodiment. The transistor 60 may be a Field-Effect Transistor (FET), in particular a Metal-Oxide-Semiconductor Field-Effect Transistor (MOSFET). The transistor 60 comprises at least one gate region 61 between at least one drain region 62 and at least one source region 63. A ratio between a width $W_G$ of the gate region 61 and a length $L_G$ of the gate region 61 exceeds 300 in embodiments. Thereby the length $L_G$ of the gate region 61 may correspond to a length of a conduction channel between the drain region 62 and the source region 63.

Hence, $W_G/L_G$ may be equal to or larger than 300 in embodiments. In some embodiments $W_G/L_G$ may be even larger than 500 or larger than 1000. For example, for a 130 nm semiconductor process technology the gate length $L_G$ may be 130 nm. Consequently the gate width $W_G$ may be larger than 39 μm (for $W_G/L_G$>300), larger than 65 μm (for $W_G/L_G$>500), or even larger than 130 μm (for $W_G/L_G$>1000).

Taking the example slab inductor 40 to be modeled of FIG. 4, the width $W_G$ of the gate region 61 may be 500 μm, corresponding to the length l of the metal line 40. The width of the whole transistor 60, including a width of the drain region 62, the gate length $L_G$, and a width of the source region 63, may correspond to α of equation (4). Taken the example of FIG. 4, α may be 50 μm. For example, for a currently available 14 nm semiconductor process technology the gate length $L_G$ may be 14 nm. Consequently the gate width $W_G$ will be larger than 4.2 μm (for $W_G/L_G$>300), larger than 7 μm (for $W_G/L_G$>500), or even larger than 14 μm (for $W_G/L_G$>1000). Note that embodiments are applicable to various past, present and future semiconductor process technologies.

Figure 7:
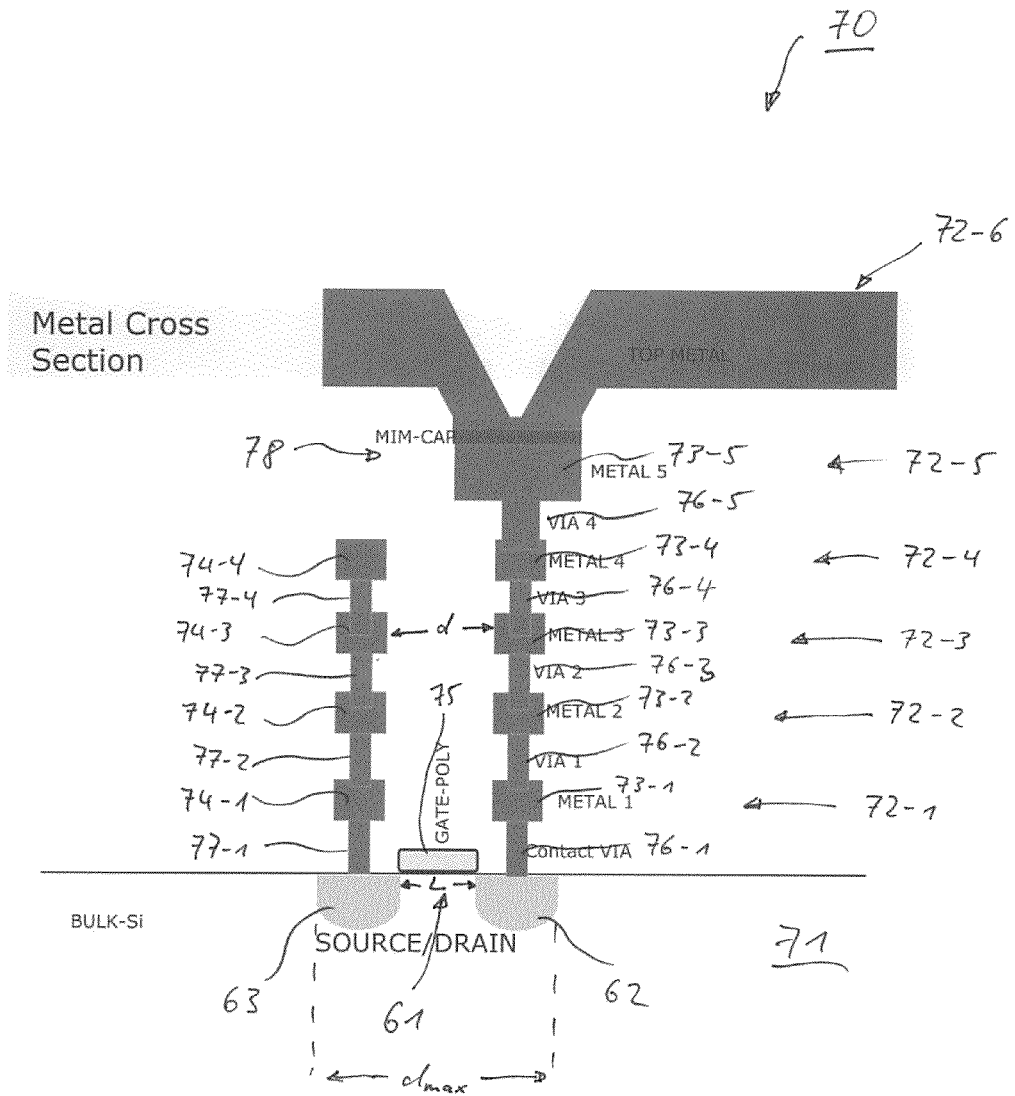
FIG. 7 is a schematic cross sectional view of an embodiment of a transistor.

FIG. 7 illustrates a schematic cross section of a transistor 70 according to an embodiment. Note that its top view may be similar to FIG. 6.

The transistor 70 comprises a stack of at least one semiconductor layer 71 and a plurality of metal layers 72-1 to 72-6. The at least one drain region 62 and the at least one source region 63 may be formed in the semiconductor layer 71. A plurality of interconnected drain contact regions 73-1 to 73-6 and a plurality of interconnected source contact regions 74-1 to 74-4 are formed in the plurality of metal layers 72-1 to 72-6. Hence, the drain contact regions 73-1 to 73-6 and the source contact regions 74-1 to 74 may comprise metal which is typically used for fabricating semiconductor devices, such as aluminum (Al) or copper (Cu), for example. In the embodiment of FIG. 7 the metal layers 72-1 to 72-6 are formed on top of the semiconductor layer 71.

In one embodiment the semiconductor layer 71 may refer to the bulk of the semiconductor in which the gate region 61, the drain region 62, and the source region 62 lie. Examples of semiconductor material include silicon (Si), silicon-germanium (SiGe), or III/V devices such as GaAs. The gate region 61 corresponds to a length of a conduction channel between the drain region 62 and the source region 63. In embodiments the conduction channel may be an n-channel or a p-channel, depending on whether the transistor 70 is implemented as an n-channel MOSFET or a p-channel MOSFET. The conduction channel between drain region 62 and source region 63 may be covered by a gate terminal 75. The gate terminal 75 may be made of polycrystalline silicon (polysilicon) as conducting gate material, for example. A gate oxide layer (not shown) may separate the gate terminal 75 of the transistor 70 from the source and drain regions 62, 63 as well as the gate region or conductive channel 61 of length $L_G$ that connects source and drain when the transistor 70 is turned on. Turning on the transistor 70 means applying a gate voltage to the gate terminal 75 in order to enable an electric current between source and drain 63, 62. As has been explained above, the length $L_G$ of the gate region 61 may depend on a used semiconductor process technology. For example, the length $L_G$ may be 130 nm, 90 nm, 65 nm, 45 nm, 32 nm, 22 nm, 14 nm, or 10 nm and smaller. According to embodiments the gate width $W_G$ (into the page) will be at least 300 times larger, which can in principle be seen from FIG. 6.

As can be seen from FIG. 7, the drain region 62 may be connected to a drain contact pad (not shown) via an array of vertically stacked drain contact or metal regions 73-1 to 73-6. Thereby a first drain contact region 73-1 may be formed in a first metal layer 72-1 on top of a first oxide layer (not shown) between the semiconductor layer 71 and the first metal layer 72-1. A second drain contact region 73-2 may be formed in a second metal layer 72-2 on top of a second oxide layer (not shown) between the first metal layer 72-1 and the second metal layer 72-2. A third drain contact region 73-3 may be formed in a third metal layer 72-3 on top of a third oxide layer (not shown) between the second metal layer 72-2 and the third metal layer 72-3, etc. Likewise, the source region 63 may be connected to a source contact pad (not shown) via an array of vertically stacked source metal regions 74-1 to 74-4. Thereby a first source contact region 74-1 may be formed in the first metal layer 72-1 on top of the semiconductor substrate 71 and the first oxide layer. A second source contact region 74-2 may be formed in the second metal layer 72-2 on top of the first metal layer 72-1 and the second oxide layer. A third source contact region 74-3 may be formed in the third metal layer 72-3 on top of the second metal layer 72-2 and the third oxide layer, etc.

The plurality of drain contact regions 73-1 to 73-5 may be interconnected by means of vias 76-1 to 76-5, respectively. A via is a small opening in an insulating oxide layer that allows a conductive connection between different metal layers 72 or between different metal layer 72-1 and semiconductor regions 62, 63. Likewise, the plurality of source contact regions 74-1 to 74-4 may be interconnected by means of vias 77-1 to 77-4, respectively. In some embodiments the drain contact regions 73-1 to 73-5 may be formed as conductive lines, respectively. These drain lines 73-1 to 73-5 may extend in parallel to the drain region 62. The source contact regions 74-1 to 74-4 may also be formed as conductive lines, respectively. These source lines 74-1 to 74-4 may extend in parallel to the source region 63.

The plurality of drain contact regions/lines 73-1 to 73-4 and the vias 76-1 to 76-4 may be regarded as a first plate of a capacitor formed between the drain region 62 and the source region 63 when the transistor 70 is in an OFF-mode, i.e., when the channel in the gate region 61 is not conducting. The plurality of source contact regions/lines 74-1 to 74-4 and the vias 77-1 to 77-4 may be regarded as the second plate of the capacitor. The plurality of drain contact regions 73-1 to 73-4 and the vias 76-1 to 76-4 as well as the plurality of source contact regions 74-1 to 74-4 and the vias 77-1 to 77-4 may be formed such that the two plates run substantially in parallel to each other and have a distance d. The distance d may depend on a distance between one of the drain contact region 73-1 to 73-4 and a source contact region 74-1 to 74-4 of the same metal layer 72-1 to 72-4. As may be seen from FIG. 7, a maximum distance d between one of the drain contact regions 73-1 to 73-4 and a source contact region 74-1 to 74-4 of the same metal layer 72-1 to 72-4 may be smaller than or equal to a maximum distance $d_{max}$ between the drain region 62 and the source region 63. Thereby, the maximum distance $d_{max}$ may correspond to the gate length $L_G$ plus the extensions of the drain/source regions 62, 63, respectively. In some embodiments the distance d may be in the range from $L_G$ to $3L_G$, for example. Hence, a minimum distance between a drain contact region 73-1 to 73-4 and a source contact region 74-1 to 74-4 in the same metal layer 72-1 to 72-4 may substantially correspond to the length $L_G$ of the gate region 61. In other words, the distance d between the OFF-mode capacitor plates formed by the plurality of vertically stacked drain contact regions 73-1 to 73-4 and the related vias 76-1 to 76-4 and by the plurality of vertically stacked source contact regions 74-1 to 74-4 and the related vias 77-1 to 77-4 may be in the range from $L_G$ to $3L_G$.

Figure 8:
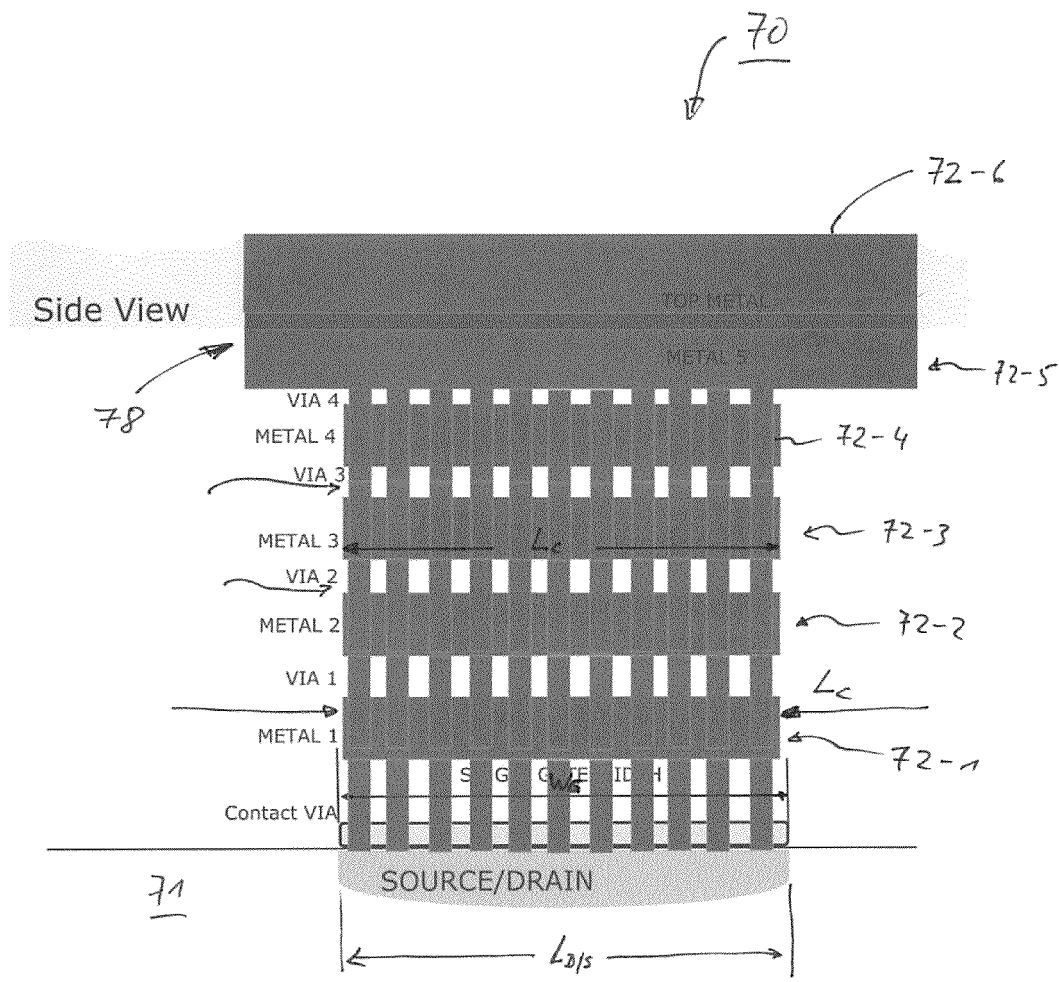
FIG. 8 is a schematic side view of an embodiment of a transistor.

As can be seen from the schematic side view of FIG. 8, a length $L_C$ of the drain contact regions and/or the source contact regions formed in the metal layers 72-1 to 72-4 may substantially correspond to the gate width $W_G$. A length $L_D$ of a drain contact region may hence substantially correspond to the width $W_G$ of the at least one gate region 61 and/or a length $L_S$ of a source contact region substantially may correspond to the width $W_G$ of the at least one gate region 61. This means that a ratio between the length $L_C$ of the drain/source contact regions and their distance d to each other will be similar to $W_G/L_G$. Hence, the ratio between the length $L_C$ of the drain/source contact regions and their distance d may also be equal to or larger than 300 in some embodiments. Also, a length $L_{D/S}$ of the drain/source regions 62, 63 may substantially correspond to the gate width $W_G$. This means that a ratio between the length $L_{D/S}$ of the drain/source regions 62, 63 and their distance $L_G$ to each other will be similar to $W_G/L_G$. Hence, the ratio between the length $L_{D/S}$ of the drain/source regions 62, 63 and their distance $L_G$ may be equal to or larger than 300 in some embodiments.

In this way, the plurality of interconnected drain contact regions and the plurality of interconnected source contact regions formed in the metal layers 72-1 to 72-4 together with the parasitic gate/source gate/drain overlap capacitances may yield an OFF-mode capacitance $C_{off}$ of the transistor 70 above a predefined threshold. In some embodiments the off-mode capacitance $C_{off}$ of the transistor 70 at a reference frequency $f_{ref}$ may be $$C_{off} > \frac{10}{2\pi f_{ref} R_{ref}}, \quad (5)$$

wherein $R_{ref}$ denotes a reference resistance of a reference system, for example a 50 Ohm system. For integrated tunable RF impedance matching networks the reference frequency $f_{ref}$ may reach from some MHz to several GHz, for example. The reference frequency $f_{ref}$ range may also have an influence on the dimensions of the transistors 60, 70.

Note that the off-mode capacitance of the transistor 70 may be designed relatively high even without the metal layers 72. This may be achieved by an appropriate overlap region between the gate terminal 75 and the drain and/or source regions 62, 63, respectively. A small thickness of the gate oxide layer between the gate terminal or electrode 75 of the transistor 70 and the drain and/or source regions 62, 63 may cause a relatively high off-mode capacitance even without the metal layers 72. Hence, the off-mode capacitance of the transistor 70 may be caused by interplay of the off-mode capacitance due to the metal layers 72 and the off-mode capacitance due to the overlap region between the gate terminal 75 and the drain and/or source regions 62, 63, respectively.

To further increase the OFF-mode capacitance $C_{off}$ of the transistor 70 one or more additional capacitors may be formed in the layer stack. For example, as can be seen from FIGS. 7 and 8, a first drain contact region formed by top metal layer 72-6 and an adjacent second drain contact region formed by metal layer 72-5 may be connected via MIM capacitor 78. In other words, metal layer 72-6, metal layer 72-5, and an isolating layer in between may form a MIM capacitor 78. Alternatively or additionally a first source contact region (e.g. formed by metal layer 72-6) and an adjacent second source contact region (e.g. formed by metal layer 72-5) may be connected via a MIM capacitor. The person skilled in the art will appreciate that such additional capacitors may also be formed between other metal layers of the metal layer stack 72-1 to 72-6.

In the example illustrated in FIGS. 7 and 8 all or almost all metal layers 72-1 to 72-6 of the stack are used to form metal contact regions for the at least one drain region 62 and the at least one source region 63. This may yield a desired OFF-mode capacitance and/or a desired ON-mode inductance of the transistor 70.

Figure 9:
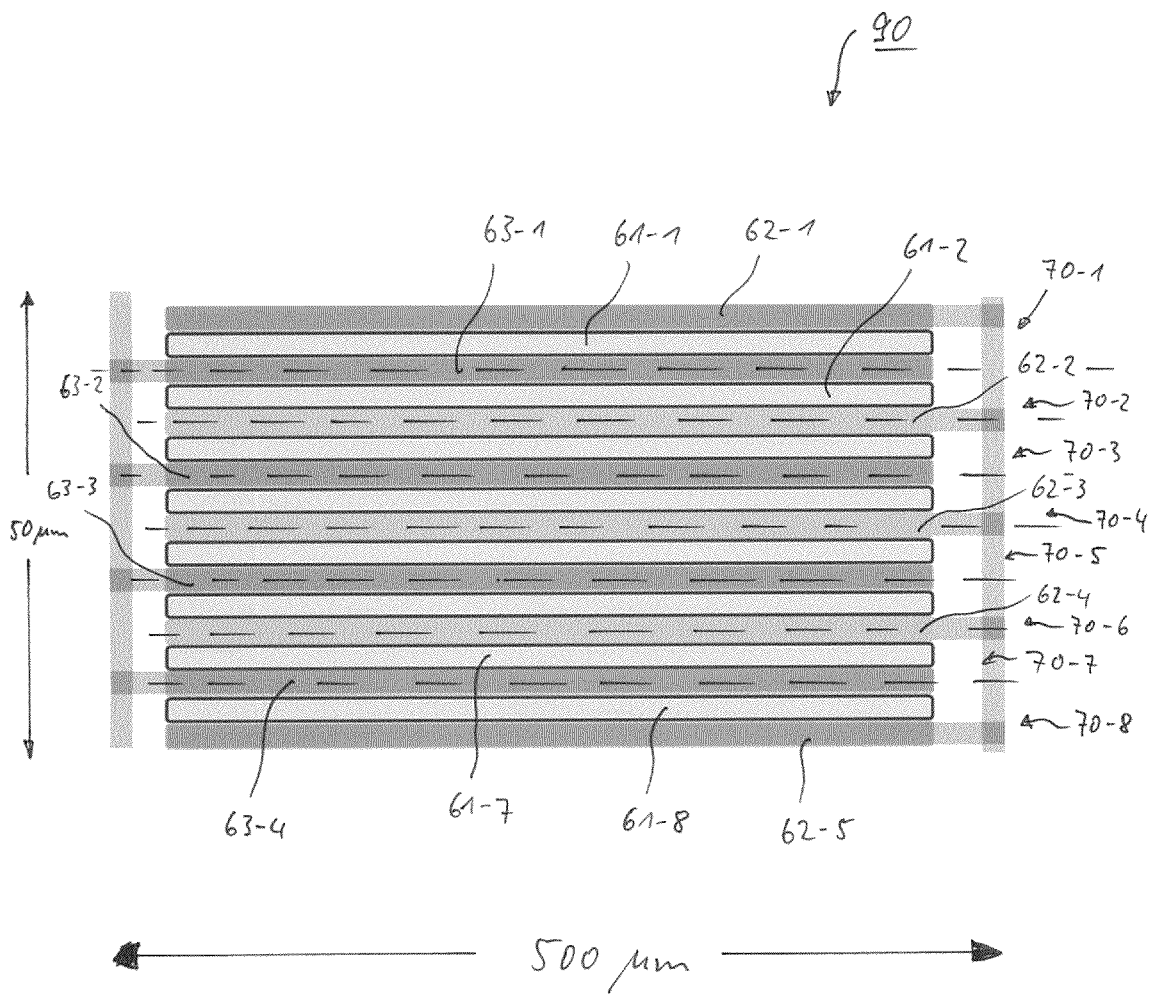
FIG. 9 is a schematic top view of an embodiment of a multi-finger transistor.

Note that FIGS. 7 and 8 illustrate an example with only one transistor according to an embodiment. However, other embodiments also include implementations with multiple transistors. The top view of FIG. 9 shows an example embodiment of a multi-finger transistor structure 90. The example multi-finger transistor structure 90 comprises eight gate regions 61-1 to 61-8 forming eight transistor structures 70-1 to 70-8 connected in parallel. Note that the multi-finger transistor structure 90 still yields one transistor, however, with eight times the metallization compared to the single transistor structure 60, 70. This means that an OFF-mode capacitance of the multi-finger transistor 90 will be approximately eight times larger than that of transistor 70. The same holds for the ON-mode inductance.

In embodiments the metallization of a transistor may be formed such that it approximates a slab inductor to be modeled, as, for example, the slab inductor 40 of FIG. 4. The transistors 60, 70, 90 may be formed in a stack of at least one semiconductor layer 71 for the drain regions 62 and the source regions 63 and at least one metal layer 72-1 to 72-6 for related metal contact regions/lines. A shape of the metal contact regions/lines in the at least one metal layer 72-1 to 72-6 may be formed to model a shape of a slab inductor. This is what can be seen in the example of FIG. 9, where a length of the multi-finger transistor 90 corresponds to l=500 μm and a width of the multi-finger transistor 90 corresponds to α=50 μm (see FIG. 4). The area of the transistor 90 has a rectangular shape corresponding to the shape of the slab inductor 40. A number of gate fingers fitting in the width α of the area may be less than 30. In the example of FIG. 9 the gate fingers associated with the width α of the area is eight. Hence the transistor 90 or its metallization may have substantially the same dimension as the slab inductor 40 to be modeled. In this way the gate regions 61, the drain regions 62, and/or the source region 63 may be dimensioned in a volume of the transistor 90 such that an inductance of the transistor deviates from equation (4) by less than 20% or at most less than 30%.

Figure 10:
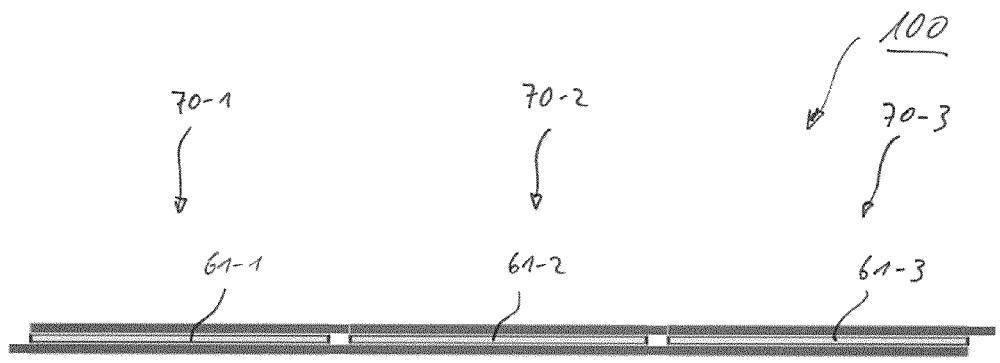
FIG. 10 is a schematic top view of a further embodiment of a multi-finger transistor.

Another alternative implementation of a multi-finger transistor 100 is sketched in FIG. 10. Here, the individual transistors 70-1, 70-2, 70-3 may also be electrically connected in parallel but in a different geometrical shape. Here the shape of the multi-finger transistor 100 resembles the shape of a wire line, for example. Depending on the arrangement of the drain and source regions 62, 63, the structure of FIG. 10 may also be used to model a coil structure, e.g. a spiral inductor.

Figure 11:
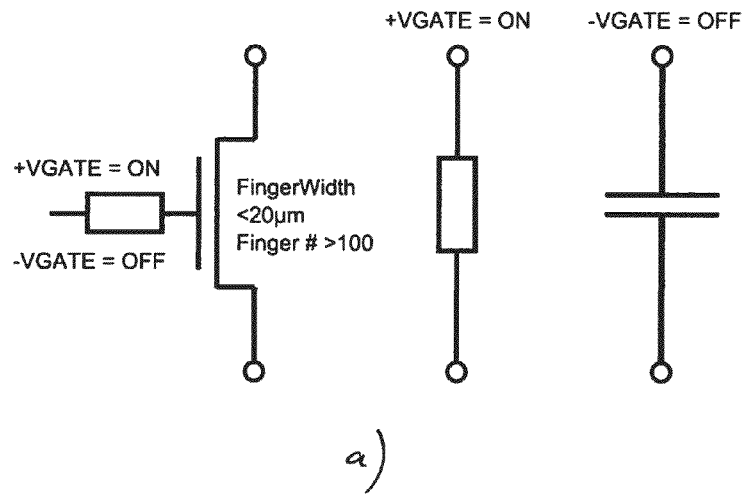
FIG. 11a is an equivalent circuit of a conventional switch transistor.
FIG. 11b is an equivalent circuit of a switch transistor according to an embodiment.
Figure 11:
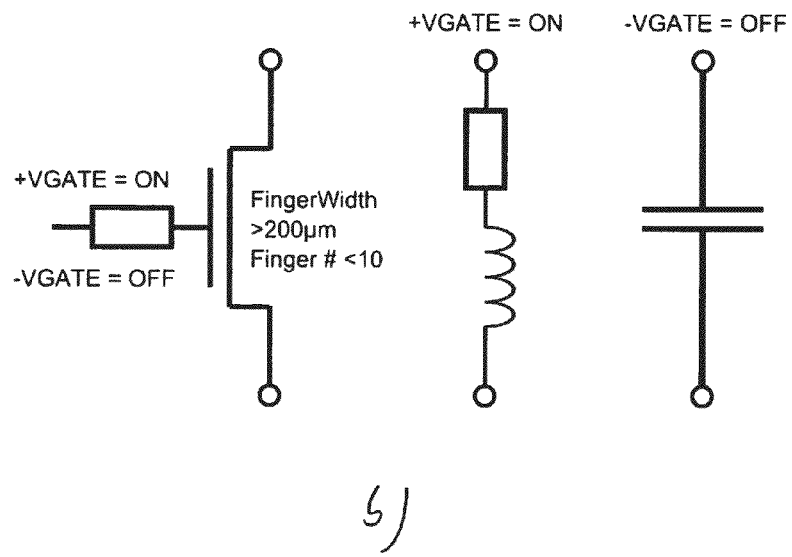

In contrast to a classic switch transistor layout, some embodiments may use more than one or all metal layers regardless of an increase in OFF-mode capacitance $C_{off}$. Transistors according to various embodiments show a different behavior than a classic RF switch transistor. In a classic switch configuration the transistor has the functionality of FIG. 11a. Note that the examples illustrated in FIGS. 11a and 11b are based on a 130 nm semiconductor process technology. For a classic or conventional RF switch (FIG. 11a) with a gate finger width of less than 20 μm and a gate finger number of more than 100 the operation between an ON-mode (resistance) and an OFF-mode (low OFF-mode capacitance) can be selected, depending on the gate bias.

In case of a transistor layout according to embodiments, we obtain a different equivalent circuit shown in FIG. 11b. Due to the geometry, in the ON-mode we obtain an inductance similar to the slab inductor. There is still an ON-resistance, which is very low however due to the high transistor width. In the given area, approximately 40 mm of transistor width can fit, which means in C11NP technology a $R_{on}$ of 10 mΩ. Compared to a classic slab inductor with an example Q of 10 and an inductance of 0.2 nH, the slab inductor resistance is about 150 mΩ. This shows that the inductor metal dominates in this configuration, and thus the Q factor will not suffer. Considering the transistor's OFF-mode, a very high $C_{off}$ capacitance is found. While for a classic switch this is big problem, the high off mode capacitance may now be used as inductance bypass, and may even be beneficial for a tunable inductance.

Figure 12:
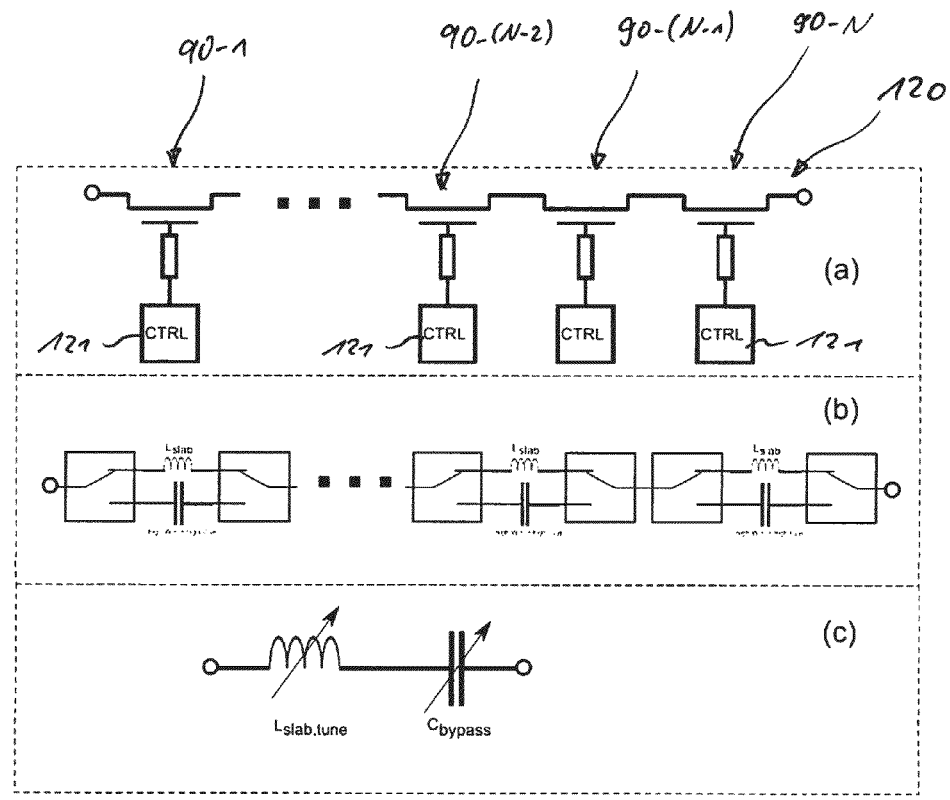
FIGS. 12a-12c show a schematic of an inductance tuner according to an embodiment.

FIG. 12 shows a schematic of an inductance tuner or a tunable inductance 120 using a plurality of N transistors 70 or 90 according to embodiments.

The example tunable inductance 120 comprises a plurality of field effect transistors according to embodiments. Each field effect transistor 90 comprises one or multiple fingers. According to embodiments a ratio between a width of a finger and a length of the finger exceeds 300. An inductance of a transistor 90 depends on a dimension of a metallization associated with its at least one finger. According to some embodiments the transistors 90 may be multi-finger field effect transistors, respectively.

As has been explained with reference to FIG. 9, a multi-finger field effect transistor 90 may comprise multiple gate fingers 61, multiple drain fingers 62, and multiple source fingers 63, respectively. Thereby a ratio between a width of a gate finger 62 and a length of the gate finger may exceed 300 according to embodiments. In some embodiments the geometry of the transistor's metallization may be formed to model a shape of a slab inductor. Alternatively or additionally the metallization of a multi-finger field effect transistor 90 may be formed such that an off-mode capacitance $C_{off}$ of the multi-finger field effect transistor at a reference frequency $f_{ref}$ is $$C_{off} > \frac{10}{2\pi f_{ref} R_{ref}},$$

wherein $R_{ref}$ denotes a reference resistance of a reference system.

Figure 13:
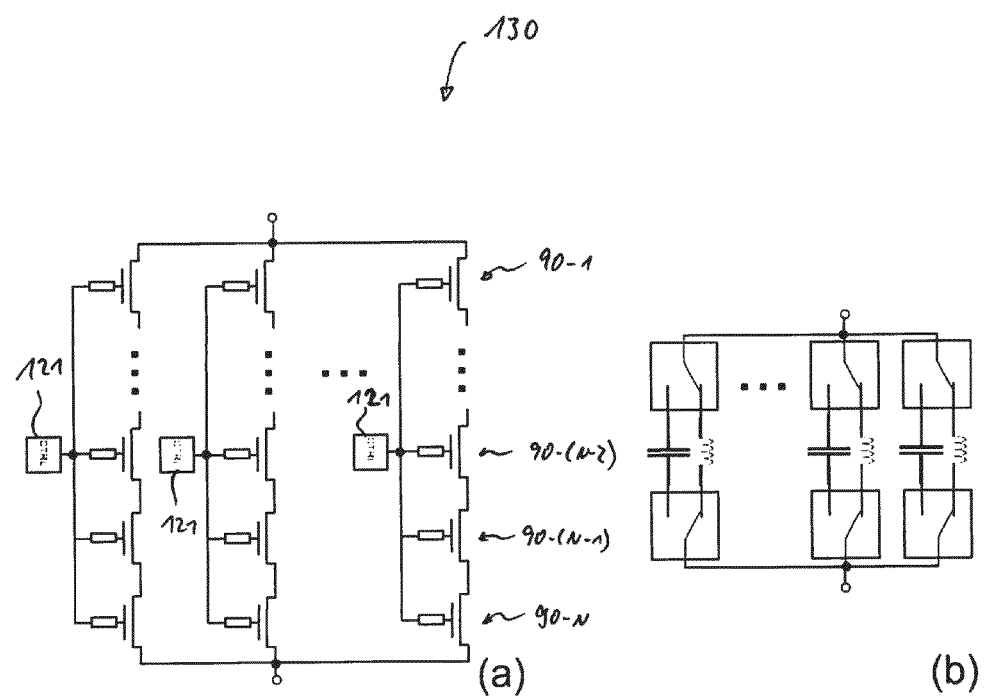
FIGS. 13a-13b show a schematic of an inductance tuner according to a further embodiment.

In the example inductance tuner 120 of FIG. 12a the plurality of multi-finger field effect transistors 90 is connected in series, while in the example inductance tuner 130 of FIG. 13a the plurality of field effect transistors 90 is connected in parallel. Note that other configurations are possible as well.

In FIG. 12a the series connection is such that source terminal of transistor 90-2 is coupled to drain terminal of transistor 90-1. Source terminal of transistor 90-3 is coupled to drain terminal of transistor 90-2, etc. Each of the transistors 90 comprises control circuitry 121 coupled to its respective gate terminal. The control circuitry 121 may be used to decrease the tunable inductance by switching one or more multi-finger field effect transistors 90 of the inductance tuner 120 in an OFF-mode and/or to increase the tunable inductance by switching one or more multi-finger field effect transistors 90 in an ON-mode. FIG. 12b illustrates an equivalent circuit diagram for the case when all transistors 90 are switched in the ON-mode, yielding a maximum inductance $L_{slab,tune}$.

In FIG. 13a each branch of the parallel connection comprises a series connection of a plurality of transistors according to embodiments. A series connection of a branch is such that source terminal of transistor 90-2 is coupled to drain terminal of transistor 90-1. Source terminal of transistor 90-3 is coupled to drain terminal of transistor 90-2, etc. All transistors of a particular branch are connected to the same control circuitry 121 to switch all transistors of the branch either in an OFF-mode (OFF-mode capacitance) or in an ON-mode (ON-mode inductance). FIG. 13b illustrates an equivalent circuit diagram for the case when all transistors 90 of inductance tuner 130 are switched in ON-mode, yielding a parallel connection of inductances. Through different switch positions arbitrary parallel LC circuits may be obtained. In case all transistors 90 of inductance tuner 130 are switched in the OFF-mode a maximum capacitance from a plurality of parallel capacitances is obtained.

Hence, if transistors according to embodiments are used in the series configuration of FIG. 12, it is possible to achieve a tunable inductance. Hence, by switching N times the structure 90 in series, a $N*L_{slab}$ inductance may be found for maximum inductance, whereas the minimum inductance (all transistors switched in OFF-mode) would be $$ZL_{min} = \omega \left( L_{slab} - \frac{N}{\omega^2 C_{OFF}} \right) \quad (6)$$

This shows, that a very high $C_{off}$ is even recommended. Looking at the Q factor, a high $C_{off}$ may also improve $$Q_{MIN} = \frac{\omega \left( L - \frac{N}{\omega^2 C_{OFF}} \right)}{R} \quad (7)$$

For maximum inductance (all transistors switched in the ON-mode), the Q factor will be identical to the single $L_{slab}$, as R and L scale with N. Assuming a very high $C_{off}$, one can see that the Q factor stays flat over the selected inductance. Consequently, a very high transistor width $W_G$ may improve the Q factor by the following observations:

reducing the resistance in inductance mode (ON-mode),
a high $C_{off}$ may improve the Q-factor for low inductance values (one or more transistors in the OFF-mode).

Hence, some embodiments use all available metal and even optional MIM-caps to increase $C_{off}$.

To summarize, one idea of embodiments is the use of a transistor in a low finger setup, but with very high transistor width to obtain an inductive layout as shown in FIG. 11b. This structure can be stacked to a transmission line and even a planar inductor may be formed out of such "slab-transistors". It may only be considered, that the "slab-transistor" inductance stays low, and the off capacitance high, to avoid high RF voltages. In other words, a low impedance value can only cause a small voltage drop. The very high $C_{off}$ inherently protects the transistor.

Figure 14:
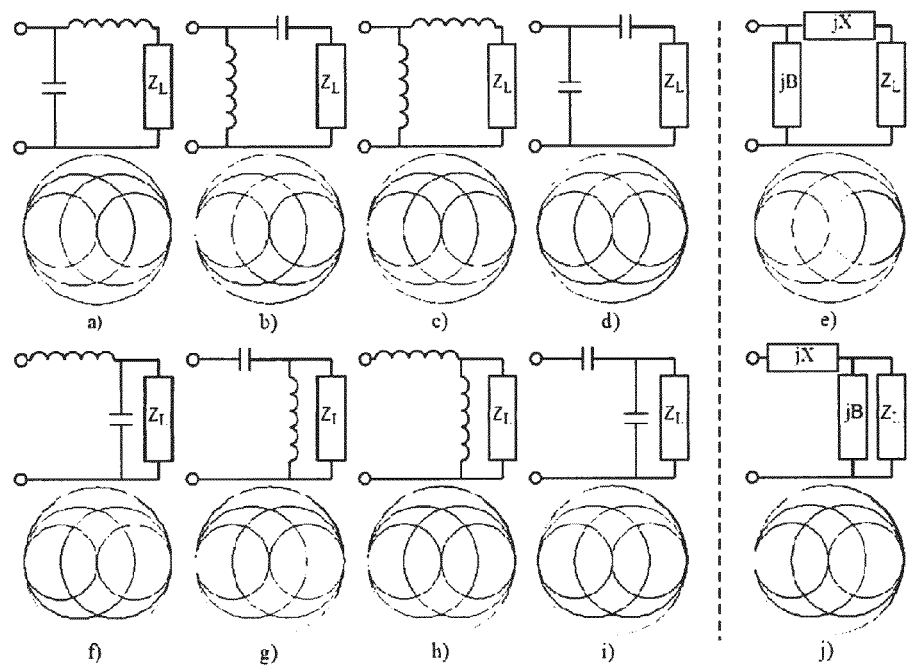
FIG. 14 illustrates possible impedance areas that can be addressed with two reactive devices.

It should be mentioned that the tunable inductance may just be a part of a tunable filter or an adaptive matching network. For a matching network, the provided circuit may be found dependent on the matching topology several times. An overview of possible structures addressing (white) S-Parameter areas with two reactive devices is found in FIG. 14. Out of these, the most important π-type and T-type structures can be synthesized, that allow theoretically all points in a smith chart.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A transistor, comprising:
   a stack of at least one semiconductor layer and a plurality of metal layers,
   at least one gate region between at least one drain region and at least one source region, wherein a ratio between a width of the gate region and a length of the gate region exceeds 300,
   wherein the at least one drain region and the at least one source region are formed in the at least one semiconductor layer, and
   wherein a plurality of interconnected drain contact regions and a plurality of interconnected source contact regions are formed in the plurality of metal layers,
   wherein the at least one drain region is connected to a drain contact pad via an array of vertically stacked drain contact regions, wherein a first drain contact region is formed in a first metal layer and wherein a second drain contact region is formed in a second metal layer, and
   wherein the at least one source region is connected to a source contact pad via an array of vertically stacked source metal regions, wherein a first source metal region is formed in the first metal layer and wherein a second source metal region is formed in the second metal layer.

2. The transistor of claim 1, wherein the length of the gate region corresponds to a length of a conduction channel between the drain region and the source region.

3. The transistor of claim 1, wherein the array of vertically stacked drain contact regions and the array of vertically stacked source contact regions are formed in the plurality of metal layers to yield an off-mode capacitance of the transistor above a predefined threshold.

4. The transistor of claim 1, wherein the off-mode capacitance of the transistor at a reference frequency $f_{ref}$ is $$C_{off} > \frac{10}{2\pi f_{ref} R_{ref}}$$

wherein $R_{ref}$ denotes a reference resistance of a reference system.

5. The transistor of claim 1, wherein a maximum distance between a drain contact region and a source contact region of a same metal layer is smaller than or equal to a maximum distance between the drain region and the source region.

6. The transistor of claim 1, wherein a minimum distance between a drain contact region and a source contact region in a same metal layer corresponds to the length of the gate region.

7. The transistor of claim 1, wherein a length of a drain contact region substantially corresponds to the width of the at least one gate region and/or wherein a length of a source contact region substantially corresponds to the width of the at least one gate region.

8. The transistor of claim 1, wherein the first drain contact region and an adjacent second drain contact region are connected via a Metal-Insulator-Metal capacitor and/or wherein a first source contact region and an adjacent second source contact region are connected via a Metal-Insulator-Metal capacitor.

9. The transistor of claim 1, wherein the at least one gate region, the at least one drain region, and/or the at least one source region are dimensioned in a volume of the transistor such that an inductance of the transistor deviates from $$L = 2\left[\left(\frac{2l}{a+b}\right) + \frac{1}{2} + \frac{0.2235(a+b)}{l}\right]$$

by less than 20%,
wherein l denotes the width of the gate region, a denotes a breadth of the volume, and wherein b denotes a height of the volume.

10. The transistor of claim 1, wherein the transistor comprises a multi-finger MOS transistor structure and wherein the gate region corresponds to one of a plurality of gate fingers of the multi-finger MOS transistor structure.

11. The transistor of claim 1, wherein an area of the transistor has a rectangular shape, and wherein a number of gate fingers associated with a breadth of the area is less than 30.

12. The transistor of claim 1, wherein the transistor is formed in the stack of the at least one semiconductor layer for the drain regions and the source regions and at least one metal layer for related contact regions, wherein a shape of metal contact regions in the at least one metal layer is formed to model a shape of a slab inductor.

13. A transistor, comprising:
a stack of at least one semiconductor layer and a plurality of metal layers;
at least one drain region and at least one source region formed in the at least one semiconductor layer; and
a stack of interconnected drain metal regions formed in the plurality of metal layers, wherein the stack of interconnected drain metal regions is electrically connected to the at least one drain region;
a stack of interconnected source metal regions formed in the plurality of metal layers, wherein the stack of interconnected source metal regions is electrically connected to the at least one source region;
wherein a maximum distance between a drain metal region and a source metal region of a same metal layer is smaller than or equal to a maximum distance between the at least one drain region and the at least one source region to yield an off-mode capacitance of the transistor above a predefined threshold.

14. The transistor of claim 13, wherein the at least one drain region is connected to a drain contact pad via the stack of interconnected drain metal regions, wherein the stack of interconnected drain metal regions is arranged as an array of vertically stacked drain metal regions, wherein a first drain metal region is formed in a first metal layer and wherein a second drain metal region is formed above the first drain metal region in a vertically adjacent second metal layer, and wherein the at least one source region is connected to a source contact pad via the stack of source metal regions, wherein the stack of source metal regions is arranged as an array of vertically stacked source metal regions, wherein a first source metal region is formed in the first metal layer and wherein a second source metal region is formed above the first source metal region in the second metal layer.

15. The transistor of claim 13, wherein the stack of interconnected drain metal regions and the stack of interconnected source metal regions are formed in the plurality of metal layers to yield the off-mode capacitance $C_{off}$ of the transistor above the predefined threshold, wherein the off-mode capacitance $C_{off}$ of the transistor at a reference frequency $f_{ref}$ is $$C_{off} > \frac{10}{2\pi f_{ref} R_{ref}}$$

wherein $R_{ref}$ denotes a reference resistance of a reference system.

16. The transistor of claim 13, wherein a first drain metal region and an adjacent second drain metal region are connected via a Metal-Insulator-Metal capacitor and/or wherein a first source metal region and an adjacent second source metal region are connected via a Metal-Insulator-Metal capacitor.

17. The transistor of claim 13, comprising at least one gate region between the at least one drain region and the at least one source region, wherein a ratio between a width of the gate region and a length of the gate region exceeds 300.

18. A tunable inductance comprising a plurality of multi-finger field effect transistors, each multi-finger field effect transistor comprising multiple fingers, wherein a ratio between a width of a finger and a length of the finger exceeds 300, and wherein an inductance of a multi-finger field effect transistor depends on a dimension of a metallization associated with its multiple fingers.

19. The tunable inductance of claim 18, further comprising control circuitry to decrease the tunable inductance by switching one or more multi-finger field effect transistors in an off-mode, and to increase the tunable inductance by switching one or more multi-finger field effect transistors in an on-mode.

* * * * *